United States Patent [19]

Onodera et al.

[11] Patent Number: 4,791,471
[45] Date of Patent: Dec. 13, 1988

[54] SEMICONDUCTOR INTEGRATED CIRCUIT DEVICE

[75] Inventors: Tsukasa Onodera; Haruo Kawata; Toshiro Futatsugi, all of Atsugi, Japan

[73] Assignee: Fujitsu Limited, Kawasaki, Japan

[21] Appl. No.: 158,043

[22] Filed: Feb. 16, 1988

Related U.S. Application Data

[63] Continuation of Ser. No. 783,547, Oct. 3, 1985, abandoned.

[30] Foreign Application Priority Data

Oct. 8, 1984 [JP] Japan .................. 59-209876
Jul. 11, 1985 [JP] Japan .................. 60-152861
Aug. 9, 1985 [JP] Japan .................. 60-176752

[51] Int. Cl.$^4$ .......................................... H01L 29/04
[52] U.S. Cl. ...................................... 357/60; 357/22; 357/26
[58] Field of Search .................. 357/60, 26, 221, 15, 357/22 S, 22 P, 22 MD, 41

[56] References Cited

U.S. PATENT DOCUMENTS 3,457,473  7/1969  Okada et al. .................. 357/60 X
3,476,991 11/1969  Richardson et al. ............ 357/60
3,609,252  9/1971  Broce et al. .................. 357/23.1
3,634,737  1/1972  Maeda et al. .................. 357/60
3,860,948  1/1975  Ono et al. .................... 357/60
4,486,766 12/1984  Shannon ....................... 357/22 I X

FOREIGN PATENT DOCUMENTS 1229946  4/1971  United Kingdom .
1807857  7/1969  Fed. Rep. of Germany .
2454183  7/1980  France .

OTHER PUBLICATIONS

Patent Abstracts of Japan, vol. 8, No. 190, Aug. 31, 1984.
Patent Abstracts of Japan, vol. 7, No. 264, Nov. 24, 1983.
IEEE Transactions on Electron Devices, vol. ED-31, No. 10, Oct. 1984, "Piezoelectric Effects in GaAs FET's and Their Role in Orientation-Dependent Device Characteristics", by Asbeck et al., pp. 1377–1380.
M. F. Chang et al., Role of the Piezoelectric Effect in Device Uniformity of GaAs Integrated Circuits, pp. 279–281, Applied Physics Letters, vol. 45(3).
Wert, C. A., and Thomson, R. M., Physics of Solids, McGraw-Hill, 1964, 1970, p. 24.
Sze, S. M., Physics of Semiconductor Devices, John Wiley & Sons, 1981, p. 344.
Ku, San-Mei, "The Preparation of Vapor-Grown GaAs-Gap Alloys", J. of the Electrochemical Society, Sep. 1963, pp. 991–995.

Primary Examiner—Andrew J. James
Assistant Examiner—Sara W. Crane
Attorney, Agent, or Firm—Staas & Halsey

[57] ABSTRACT

In a semiconductor integrated circuit device, a plurality of a field effect transistors are formed on a (110) crystal surface of a group III-V compound semiconductor substrate having a zinc blend type crystal structure.

7 Claims, 10 Drawing Sheets

SEMICONDUCTOR INTEGRATED CIRCUIT DEVICE

This is a continuation of co-pending application Ser. No. 783,547 filed on Oct. 3, 1985, now abandoned.

BACKGROUND OF THE INVENTION

1. Field of the Invention

The present invention relates to a semiconductor integrated circuit device. More particularly, it relates to a new and improved semiconductor integrated circuit (IC) device wherein a plurality of field effect transistors (FET's) are formed on a group III-V compound semiconductor wafer.

2. Description of the Related Art

In microelectronics, mainly silicon semiconductor devices are used. Silicon transistor elements have been miniaturized to obtain a high speed operation and integrated density of the semiconductor device.

However, to realize a further improve operation speed than that obtained by the properties of silicon, a compound semiconductor integrated circuit device using gallium arsenide (GaAs), which has an electron mobility (drift velocity) remarkably larger than that of silicon, has been developed.

The present inventors found that, in the III-V group compound, e.g., GaAs, semiconductor, the gate threshold voltage ($V_{th}$), K-value (mutual conductance), and piezoelectric polarization due to stress are related to the material and thickness of an insulating layer formed on a gate electrode, and to the crystal surface and zone axis of a semiconductor substrate.

SUMMARY OF THE INVENTION

A primary object of the present invention is to provide a group III-V compound semiconductor integrated circuit device wherein a threshold voltage does not substantially depend on the thickness of an insulating layer.

A further object of the present invention is to provide a group III-V compound semiconductor integrated circuit device wherein a carrier drift velocity in a channel area is increased.

A still further object of the present invention is to provide a group III-IV compound semiconductor integrated circuit device wherein the mutual conductance (gm) is increased due to a piezoelectric effect.

According to the present invention there is provided a semiconductor integrated circuit device wherein a plurality of field effect transistors are formed on a (110) crystal surface of a group III-V compound semiconductor substrate having a zinc blende type crystal structure.

DESCRIPTION OF THE PREFERRED EMBODIMENTS

Before describing the preferred embodiments of the present invention, a conventional device will be explained.

An FET, particularly a Schottky barrier type FET, hereinafter referred to as a MES FET, conventionally uses a III-IV group compound semiconductor such as GaAs.

Figure 1:
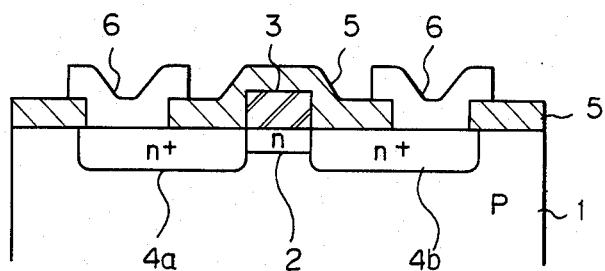
FIG. 1 is a schematic cross-sectional view of a conventional FET.

FIG. 1 is a schematic cross-sectional view of a conventional FET. As shown in FIG. 1, in a semi-insulating GaAs substrate 1, an n channel layer 2 is formed by, for example, an ion-implantation process, and a gate electrode 3 is provided on the n channel layer 2 in Schottky-contact thereto.

An $n^+$-type sorce region and an $n^+$-type drain region (4a and 4b) formed by an ion-implantation process using the gate electrode 3 as a mask. An insulating layer 5 is then formed on the substrate 1 and gate electrode 3, and source and drain electrodes 6 are provided so that they are in contact with the $n^+$ type source and drain regions 4a and 4b.

By using GaAs as the material of the substrate, as explained above, the electron mobility $\mu$ is increased from 1500 cm²/Vsec to 4000 cm²/Vsec. To obtain a high speed operation and a high integration density in the FET, the FET element is miniaturized and the gate length (Lg) is shrtened.

However, with the shortening of the Lg, short channel effect, such as the gate threshold voltage ($V_{th}$) and the K-value significantly from a desired value. The deviation from the desired value is dependent on the direction of the gate or drain current with respect to the zone axis or crystal surface of the semi-insulating GaAs substrate. One cause of this short channel effect is the piezoelectric polarization effect generated by an insulating layer on the GaAs substrate. The piezoelectric polarization results from stress on the semiconductor substrate due to the insulating layer.

Figure 2:
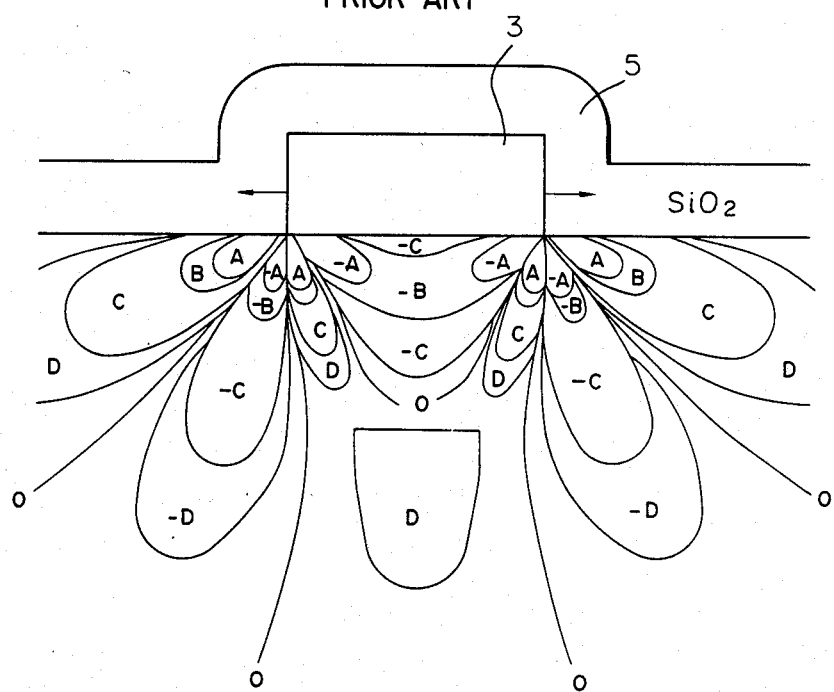
FIG. 2 is a cross-sectional view of a piezoelectric charge distribution of a conventional FET.

FIG. 2 is a cross-sectional view of a piezoelectric charge distribution of a conventional FET. The piezoelectric charge distribution causes expansion or contraction of the Schottky gate depletion layer, due to a change of carrier distribution in the channel layer (see, for example, P. M. Asbeck et al.; IEEE Transaction Electron Devices, Vol. ED-31, No. 10, October, 1984).

The piezoelectric charge is generated because of asymmetry of the crystal in the group III-V compound semiconductor, as shown in FIG. 2, and has an effect on the gate threshold voltage.

Figure 3:
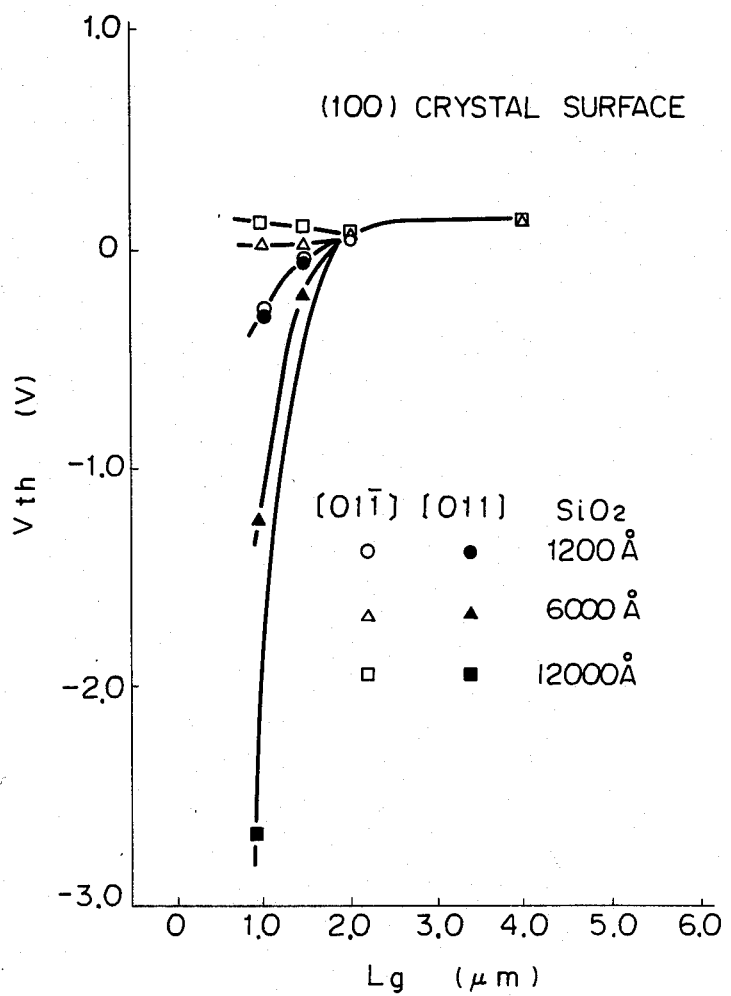
FIG. 3 is a graph the relationship between the gate threshold voltage ($V_{th}$) and the gate length (Lg) in a conventional FET.

FIG. 3 is a graph of the conventional relationship between the gate threshold voltage ($V_{th}$) and the gate length (Lg) in a conventional FET. In FIG. 3, a silicon dioxide ($SiO_2$) insulating layer and a (100) crystal surface of a GaAs single crystalline substrate were used. Gates having different gate width directions, i.e., [100] and [110], were used, and three different thicknesses of $SiO_2$, i.e., 1200 Å, 6000 Å and 12000 Å, were used.

In the [01$\bar{1}$] direction, and [011] direction (perpendicular to the [011] direction), the directions of the deviation of $V_{th}$ are positive and negative, respectively, and the amount of deviation thereof is very large as shown in FIG. 3. In this specification the marsk ( ), < > and [ ] denote crystal surface, group, and crystal direction, respectively.

Figure 4:
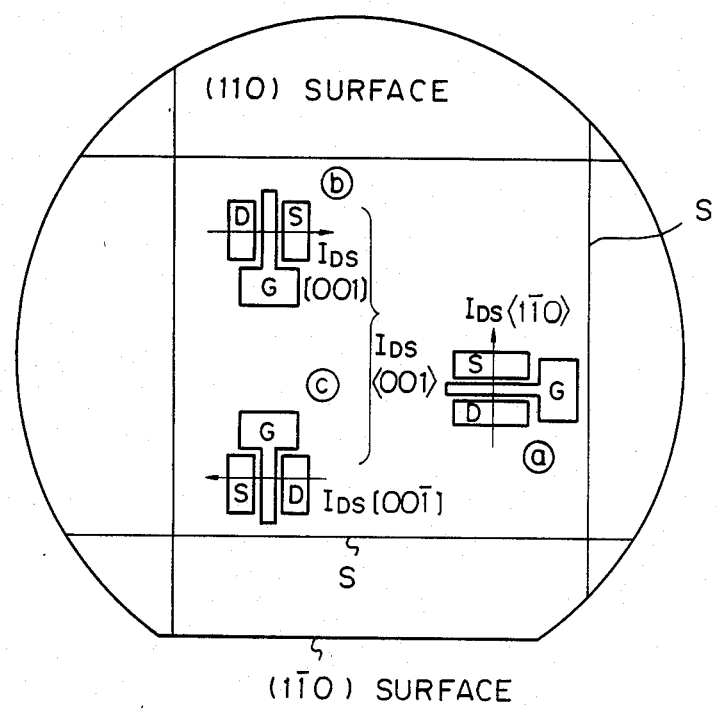
FIG. 4 is a diagram of the direction of a drain current ($I_{DS}$) according to the present invention.

The preferred embodiments of the present invention will now be described. FIG. 4 is a diagram of the direction of the drain current ($I_{DS}$) according to the present invention. FIG. 4 shows a (110) surface of a GaAs substrate. The (110) surface of FIG. 4 is a cleavage surface perpendicular to the (110) surface. Three types of FET are shown in the (110) surface of the GaAs substrate. These FETs have different $I_{DS}$ directions, i.e., a <110> direction, which corresponds to [1$\bar{1}$0] and [1$\bar{1}$0] directions in the actual (110) surface. direction parallel to the [001] direction. The <110> direction is perpendicular to both the [001] and [001] directions.

Scribelines S in FIG. 4 are parallel or perpendicular to the direction of the gate width. In such an arrangement of FETs on the (110) surface of the GaAs substrate, the properties of the FET can be improved, as explained below.

Figure 5:
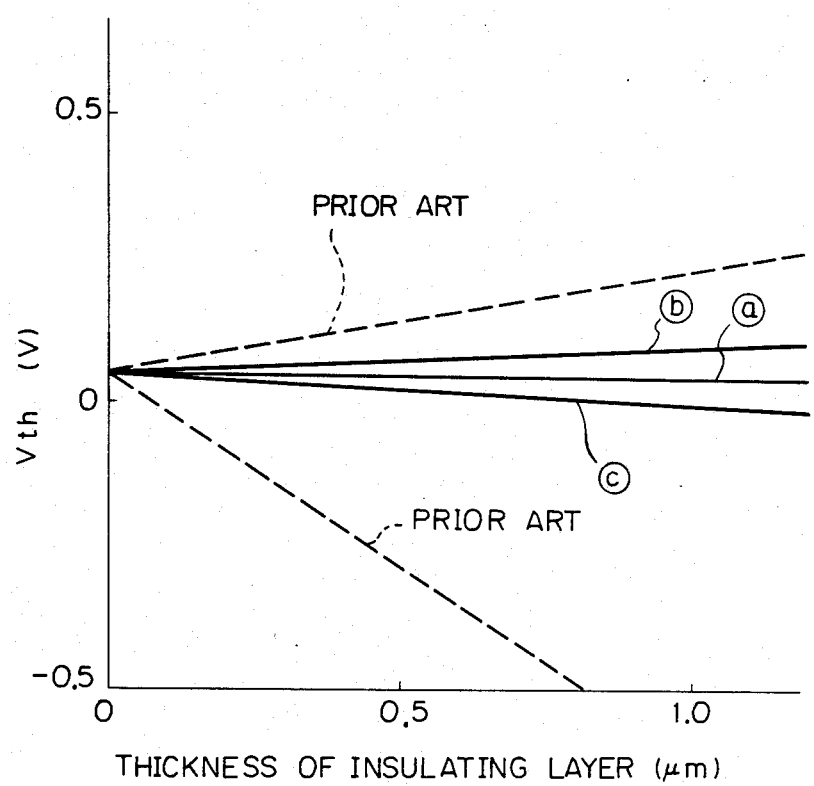
FIG. 5 is a graph of the relationship between the gate threshold voltage ($V_{th}$) and a thickness of an insulating layer.

FIG. 5 is a graph of the relationship between the gate threshold voltage ($V_{th}$) and the thickness of the insulating layer. As shown in FIG. 5, the $V_{th}$ of lines ⓐ, ⓑ and ⓒ substantially have no dependency on the thickness of the insulating layer. However, the $V_{th}$ of the prior art (shown by broken line) is remarkably dependent on the thickness of the insulating layer. The lines ⓐ, ⓑ and ⓒ correspond to those shown in FIG. 4. The gate length (Lg) of an FET used in FIG. 5 is 1.4 μm.

Figure 6:
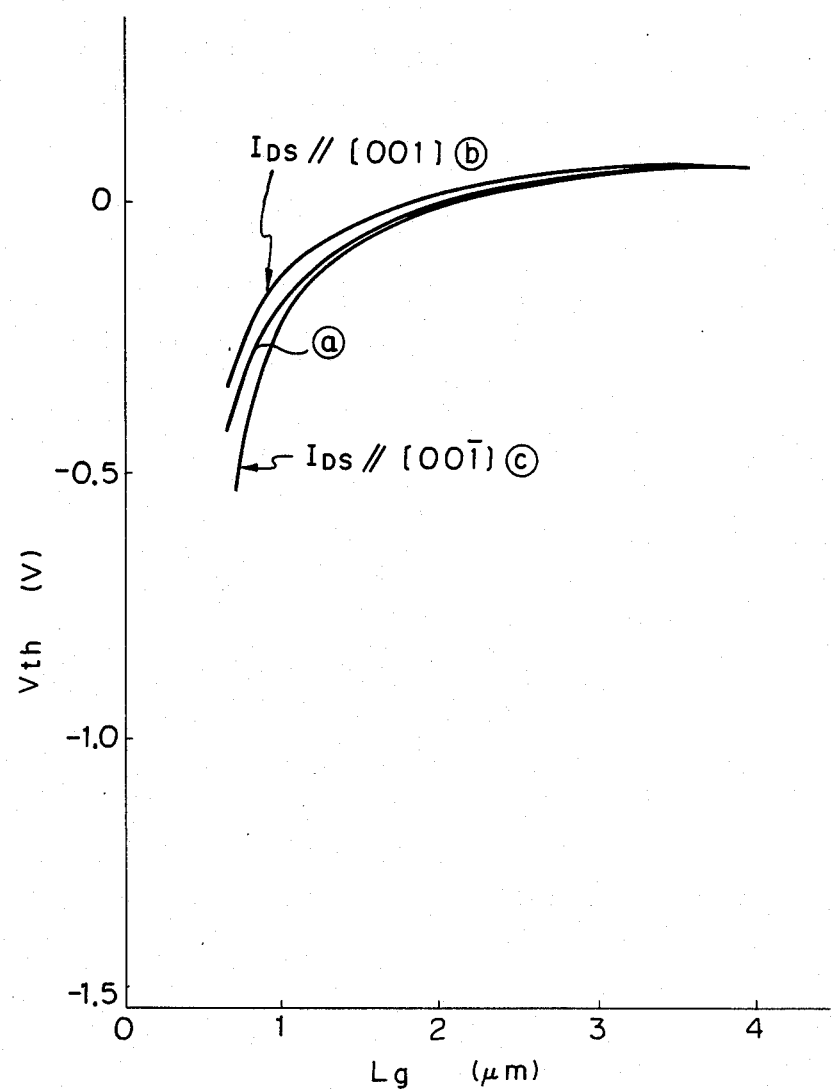
FIG. 6 is a graph of the relationship between a gate threshold voltage ($V_{th}$) and the gate length (Lg) of the present invention for three different directions of the drain current ($I_{DS}$)

FIG. 6 is a graph of the relationship between the gate threshold voltage ($V_{th}$) and gate length (Lg) in three different directions of the drain current ($I_{DS}$), according to the present invention. As shown in FIG. 6, the changes in $V_{th}$ shown by curves ⓐ, ⓑ, and ⓒ are approximately similar. The curves ⓐ, ⓑ, and ⓒ correspond to those shown in FIG. 4.

Figure 7:
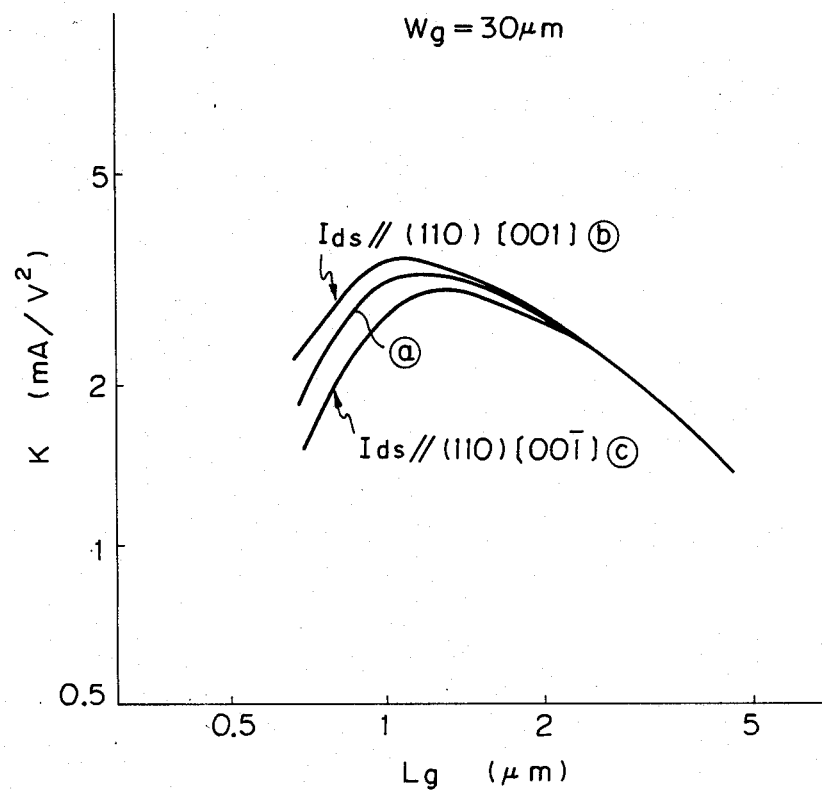
FIG. 7 is a graph of the relationship between a K-value and the gate length (Lg) of the present invention for three different directions of the drain current ($I_{DS}$)

FIG. 7 is a graph of the relationship between a K-value (mutual conductance (gm)) and gate length (Lg) in three different directions of drain current ($I_{DS}$), according to the present invention. As shown in FIG. 7, the K-value of curve ⓑ is larger than that of curves ⓐ and ⓒ. In this case, FETs having a gate width (Wg) of 30 μm were used.

In the case of curve ⓑ, the direction of the drain current is [001], as explained above and the gate width direction is [1$\bar{1}$0]. The present inventor found that, in the [1$\bar{1}$0] direction of the gate width, both side regions of a gate electrode, i.e., source and drain regions, are subjected to a piezoelectric charge distribution having opposing signs, such as ⊕ and ⊖, as shown in FIG. 8.

Figure 8:
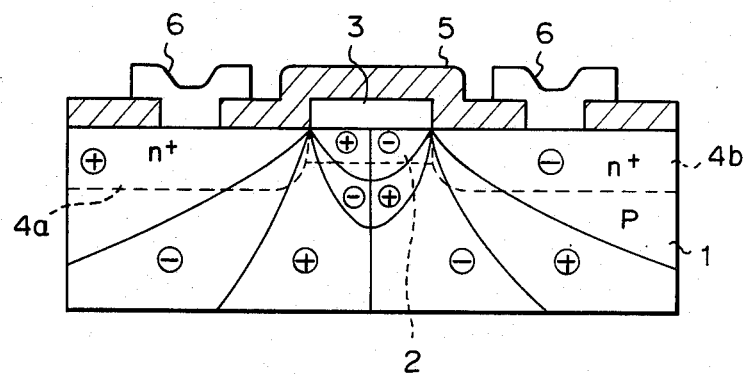
FIG. 8 is a cross-sectional view of a piezoelectric charge distribution according to the FET of the present invention.

The reference numbers for parts shown in FIG. 8 correspond to those shown in FIG. 1.

Figure 9:
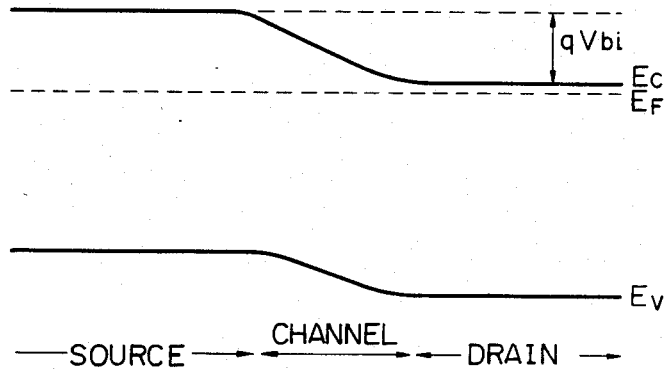
FIG. 9 is a graph of an energy band of the device in FIG. 8.

Since the $SiO_2$ layer used as the insulating layer 5 exerts a tensile force on the gate 3, the polarization distribution is different at the left and right sides of the gate 3. The source region 4a and drain region 4b have a positive charge and negative charge, respectively. In this configuration, the signs of the piezoelectric charge near the channel conductance path, which is formed near the bottom of the n+-type-layer, are negative at the source side; and positive at the drain side. Thus, the drain current $I_{DS}$ [001] represented by the curve ⓑ was selected so that the piezoelectric polarization distribution as shown in FIG. 8 is achieved. Therefore, the energy band during thermal equilibrium can be obtained having a constant bias of $qV_{bi}$ in the source region as shown in FIG. 9. This constant bias of $qV_{bi}$ strengthens the electric field acting on the carriers, resulting in an increase in the carrier or electron drift velocity, and consequently, an increaase in the mutual conductance. The piezoelectric charge distribution shown in FIG. 8 can not be obtained in silicon substrate. When a $Si_3N_4$ layer which has a compression force is used as the insulating layer 5 the polarity is reversed. Namely, the signs ⊕ and ⊖ in FIG. 8 are changed to signs ⊖ and ⊕, respectively. An increase in the K-value in accordance with the inversion of the signs for the $Si_3N_4$ layer occurs in a case where the direction of the drain current is [001].

Figure 10:
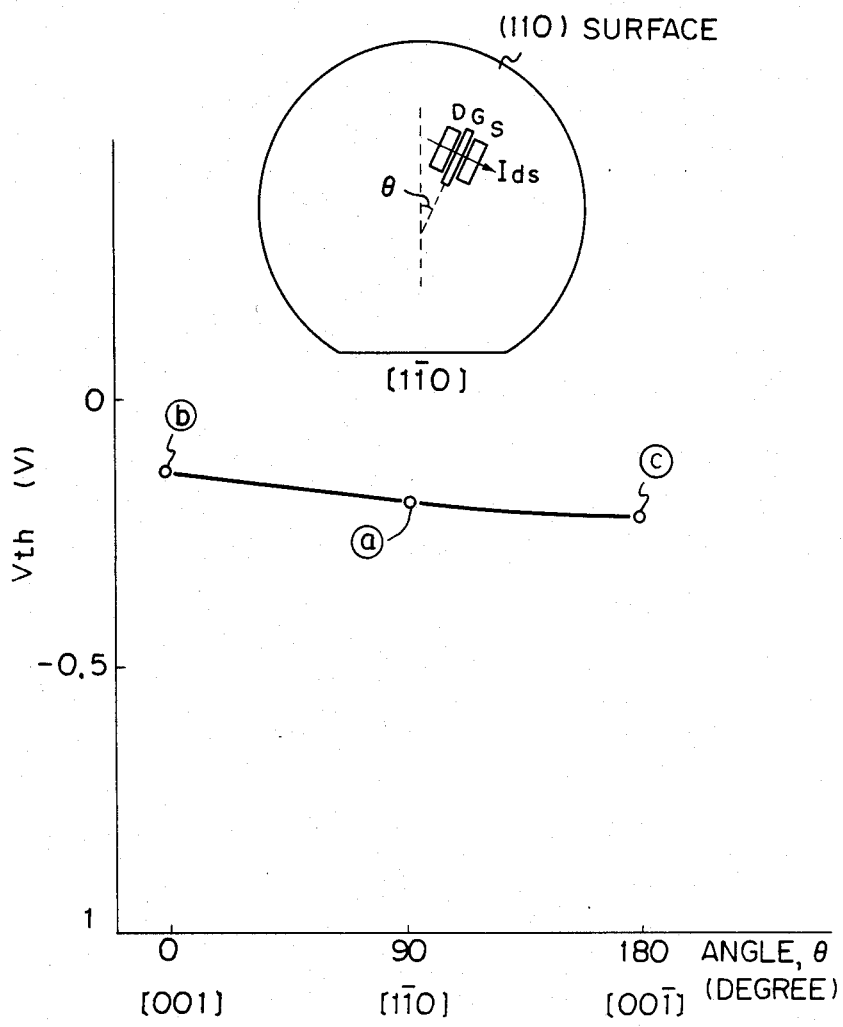
FIG. 10 is a graph of the relationship between the gate threshold voltage ($V_{th}$) and the angle formed by line a vertical to the [1$\bar{1}$0] surface and drain current according to the present invention.

FIG. 10 is a graph of the relationship between the gate threshold voltage ($V_{th}$) and an angle θ, formed by a vertical line from the [110] surface, and a gate current according to the present invention;

As shown in FIG. 10 even though the angle θ is changed from 0 to 180 degrees, the $V_{th}$ deviates very little. The symbols ⓐ, ⓑ, and ⓒ in FIG. 11 correspond to the lines shown in FIG. 4. $SiO_2$ was used as an insulating layer, and the gate length was 1 μm. As explained in FIG. 8, when a $SiO_2$ layer having a tensile force is used the K-value is increased by lines shown as ⓑ in a case where the direction of the drain current is [001]. On the other hand, when a $Si_3N_4$ layer having a compression force is used the K-value is increased in a case where the direction of the drain current is [00$\bar{1}$] as shown by the line ⓐ. Thus, in the case of an $Si_3N_4$ layer, the inclination degree of the line in FIG. 10 is inversed.

FIGS. 11A to 11D are diagrams of a process of an embodiment according to the present invention. In this process inverters consisting of enhancement mode (E) and depletion mode (D) MES FETs are formed on a (110) surface of a semi-insulating GaAs substrate.

An inverter of D1 and E1 has a [001] gate direction and an inverter of D2 and E2 has a [1$\bar{1}$0] gate direction.

Figure 11A:
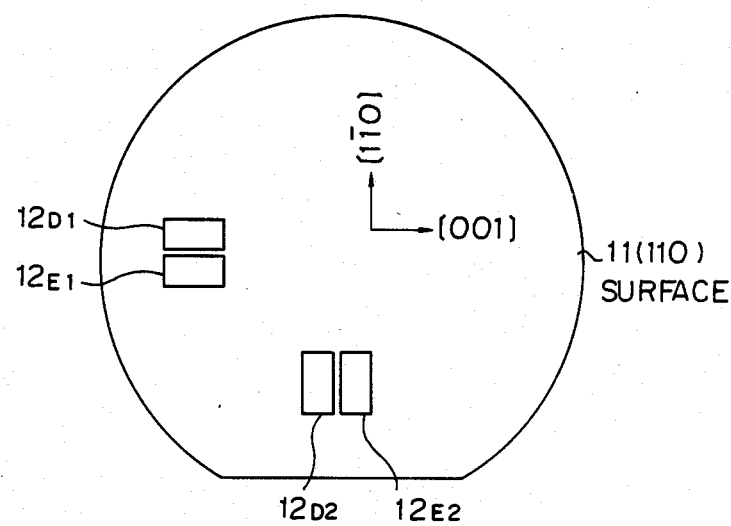
FIGS. 11A and 11D are diagrams of a process for making an embodiment according to the present invention.

As shown in FIG. 11A, an n-type channel region is formed in the (110) surface of a semi-insulating GaAs substrate 11 by an ion-implantation process at an energy of 59 KeV and dosage of $1.7 \times 10^{12}$ cm$^{-2}$ in the D mode channel region, i.e., 12D1 and 12D2, and an energy of 59 keV and dosage of $0.9 \times 10^{12}$ cm$^{-2}$ in the E mode channel region, i.e., 12E1 and 12E2. A protecting film such as aluminum nitride (AlN) (not shown) is formed over the substrate 1. An activating heat treatment is then carried out for 15 minutes at a temperature of 850° C.

Figure 11B:
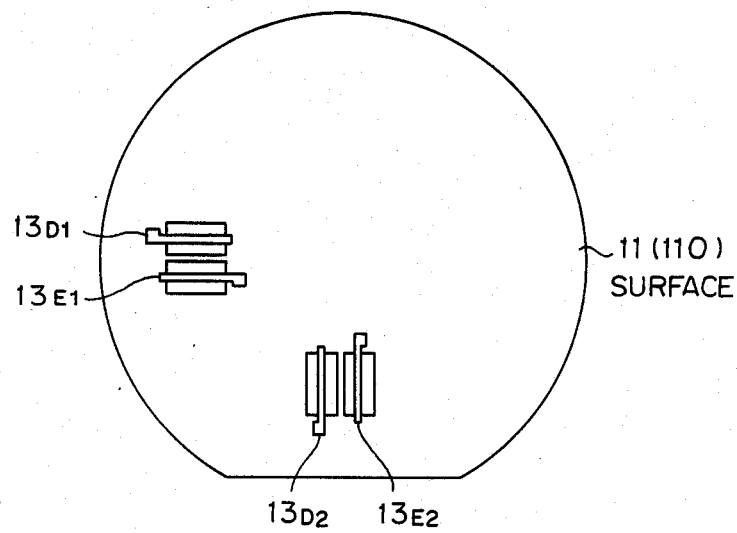

Then, as shown in FIG. 11B for example, a tungsten silicide ($W_5Si_3$) layer having a thickness of 400 nm is formed on the obtained structure by a sputtering process and patterned to form each electrode 13 having a gate length of 1 μm.

Figure 11C:
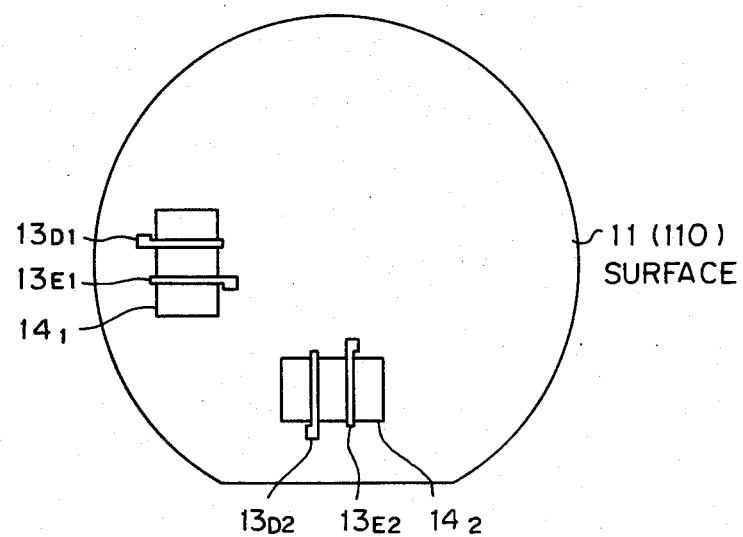

In FIG. 11C, n+-type source and drain regions 14 are formed on the obtained structure by a silicon ion injecting process using an energy of 175 keV and dosage of $1.7 \times 10^{13}$ cm$^{-2}$, and by an activating heat treatment for 10 minutes.

Figure 11D:
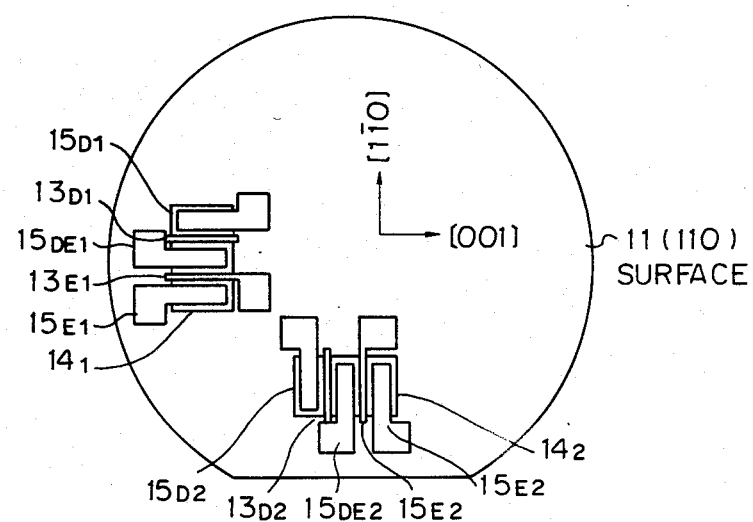

In FIG. 11D, a silicon nitride ($Si_3N_4$) layer (not shown) having a thickness of 500 μm is formed over the obtained structure by, for example, a plasma-enhanced chemical vapour deposition process. Openings are formed in the $Si_3N_4$ layer over the n+-type source and drain regions 14 to form AuGe/Au source and drain electrodes 15 having a thickness of 250 nm by a vapour deposition process.

The thus, produced MES FET elements having a D and E mode, respectively, have only a small difference in $V_{th}$, e.g., about 10 mV, and thus can be equally used.

In the present invention as the group III-V compound semiconductor having a zinc blende type crystal structure InP can be also used instead of GaAs. Further, a semiconductor integrated circuit formed on a (N10) surface of the group III-V compound semiconductor substrate also has the same properties, where N is an arbitrary integer, such as 1, 2, 3, and so on.

What is claimed is:

1. A semiconductor integrated circuit device, comprising:
   a compound semiconductor substrate formed of a group III-V compound semiconductor having a zinc blend type crystal structure, the surface of said compound semiconductor substrate being a (110) crystal surface;
   a plurality of field effect transistors, each including:
      source and drain regions formed at the surface of said compound semiconductor substrate and positioned such that the direction of a drain current is [001] with respect to said compound semiconductor substrate; and
      a gate electrode formed directly on the surface of said compound semiconductor substrate and between said source and drain regions, said gate electrode forming a Schottky contact with said compound semiconductor substrate; and
   an insulating layer formed on said gate electrode and directly on the surface of said compound semiconductor substrate adjacent to said gate electrode, said insulating layer exerting a tensile stress on said compound semiconductor substrate, the stress being applied to said compound semiconductor substrate at a boundary portion between said gate electrode and said insulating layer.

2. A semiconductor integrated circuit device comprising:
   a compound semiconductor substrate formed of a group III-V compound semiconductor having a zinc blend type crystal structure, a surface of said compound semiconductor substrate being a (110) crystal surface;
   a plurality of field effect transistors, each of said transistors including:
      source and drain regions formed at the surface of said compound semiconductor substrate and positioned such that the direction of a drain current is [001] with respect to said compound semiconductor substrate; and
      a gate electrode formed directly on the surface of said compound semiconductor substrate between said source and drain regions, said gate electrode forming a Schottky contact with said compound semiconductor substrate; and
   an insulating layer formed on said gate electrode and directly on the surface of said compound semiconductor substrate adjacent to said gate electrode, said insulating layer exerting a compression stress on said compound semiconductor substrate, a stress being applied to said compound semiconductor substrate at a boundary portion between said gate electrode and said insulating layer.

3. A semiconductor integrated circuit device comprising:
   a compound semiconductor substrate formed of a group III-V compound semiconductor having a zinc blend type crystal structure, the surface of said compound semiconductor substrate being a (110) crystal surface;
   a plurality of field effect transistors, each of said field effect transistors including:
      source and drain regions formed at the surface of said compound semiconductor substrate positioned in a direction such that a drain current flows in one of a [1$\bar{1}$0] and [$\bar{1}$10] direction with respect to said compound semiconductor substrate; and
      a gate electrode formed directly on the surface of said compound semiconductor substrate between said source and drain regions, said gate electrode forming a Schottky contact with said compound semiconductor substrate; and
   an insulating layer formed on said gate electrode and directly on the surface of said compound semiconductor substrate adjacent to said gate electrode, said insulating layer exerting a stress on said compound semiconductor substrate, a stress being applied to said compound semiconductor substrate at a boundary portion between said gate electrode and said insulating layer.

4. A semiconductor integrated circuit device including gate electrodes and scribe lines according to claim 1, wherein a chip layout is carried out so that the direction of the drain current is parallel to said scribe lines.

5. A semiconductor integrated circuit device including gate electrodes and scribe lines according to claim 1, wherein a chip layout is carried out so that the direction in which at least one of said gate electrodes extends is perpendicular to said scribe lines.

6. A semiconductor integrated circuit device according to claim 1, wherein said insulating layer is formed of $SiO_2$.

7. A semiconductor integrated circuit device according to claim 2, wherein said insulating layer is formed of $Si_3N_4$.

* * * * *

UNITED STATES PATENT AND TRADEMARK OFFICE
CERTIFICATE OF CORRECTION

PATENT NO. : 4,791,471

DATED : DECEMBER 13, 1988

INVENTOR(S) : TSUKASA ONODERA ET AL.

It is certified that error appears in the above-identified patent and that said Letters Patent is hereby corrected as shown below:

FRONT PAGE, [56] line 4, "Richardson et al." should be --Mize et al.--.

Col. 1, line 61, after "graph" insert --of--.

Col. 2, line 15, "line a" should be --a line--;
    line 37, after "4b)" insert --are--;
    line 48, "shrtened" should be --shortened--;
    line 51, after "significantly" insert --deviate--.

Col. 3, line 15, "marsk" should be --marks--;
    line 23, change "FET" to --FETs--;
    line 25, change "a" to --ⓐ--;
    line 26, change "<110>" to --<1$\bar{1}$0>--;
    line 26, change "[1$\bar{1}$0]" (second occurrence) to --[110]--;
    line 27, change ". direction" to --, ⓑ . [001] direction, and ⓒ [00$\bar{1}$].--.
    line 28, change "<110>" to --<1$\bar{1}$0>--;
    line 29, change "[001]" (second occurrence) to --[00$\bar{1}$]--.

UNITED STATES PATENT AND TRADEMARK OFFICE
CERTIFICATE OF CORRECTION

PATENT NO. : 4,791,471

DATED : DECEMBER 13, 1988

INVENTOR(S) : TSUKASA ONODERA ET AL.

It is certified that error appears in the above-identified patent and that said Letters Patent is hereby corrected as shown below:

Col. 4, line 27, "[001]" should be --[00$\bar{1}$]--;
       line 30, [110] should be --[1$\bar{1}$0]--;
       line 43, "ⓐ" should be --ⓒ--.

Column 6, line 2, claim 2, change "[001]" to --[00$\bar{1}$]

Signed and Sealed this

Thirteenth Day of June, 1989

Attest:

DONALD J. QUIGG

Attesting Officer      Commissioner of Patents and Trademarks